United States Patent
Nishitani et al.

(10) Patent No.: US 11,560,465 B2
(45) Date of Patent: Jan. 24, 2023

(54) COMPOSITION FOR CURABLE RESIN, CURED PRODUCT OF SAID COMPOSITION, METHOD OF PRODUCING SAID COMPOSITION AND SAID CURED PRODUCT, AND SEMICONDUCTOR DEVICE

(71) Applicant: ENEOS CORPORATION, Tokyo (JP)

(72) Inventors: Yoshinori Nishitani, Tokyo (JP); Masaki Minami, Tokyo (JP)

(73) Assignee: ENEOS Corporation, Tokyo (JP)

( * ) Notice: Subject to any disclaimer, the term of this patent is extended or adjusted under 35 U.S.C. 154(b) by 498 days.

(21) Appl. No.: 16/498,798

(22) PCT Filed: Mar. 30, 2018

(86) PCT No.: PCT/JP2018/013532
§ 371 (c)(1),
(2) Date: Sep. 27, 2019

(87) PCT Pub. No.: WO2018/181857
PCT Pub. Date: Oct. 4, 2018

(65) Prior Publication Data
US 2020/0024426 A1    Jan. 23, 2020

(30) Foreign Application Priority Data
Mar. 31, 2017   (JP) .............................. JP2017-072648

(51) Int. Cl.
*C08K 5/3472* (2006.01)
*H01L 23/29* (2006.01)
*C08L 79/04* (2006.01)

(52) U.S. Cl.
CPC ............ *C08K 5/3472* (2013.01); *C08L 79/04* (2013.01); *H01L 23/295* (2013.01)

(58) Field of Classification Search
CPC ............................... C08L 79/04; C08K 5/3472
See application file for complete search history.

(56) References Cited

U.S. PATENT DOCUMENTS

| 2005/0181215 | A1 | 8/2005 | Suzuki et al. |
| 2012/0318571 | A1* | 12/2012 | Tietze ................. C08K 5/357 523/400 |

FOREIGN PATENT DOCUMENTS

| CN | 1654539 A | 8/2005 |
| CN | 1871276 A | 11/2006 |
| JP | 2005-248164 A | 9/2005 |
| JP | 2010-013636 A | 1/2010 |
| JP | 2010-138400 A | 6/2010 |
| JP | 2012-036318 A | 2/2012 |
| JP | 2012-188629 A | 10/2012 |
| JP | 2013-060407 A | 4/2013 |
| JP | 2014-136779 A | 7/2014 |
| JP | 2016-153476 A | 8/2016 |
| WO | 2015/024256 A1 | 2/2015 |

OTHER PUBLICATIONS

Machine translation of JP 2012-188629 A, published Oct. 4, 2012.*
International Preliminary Report on Patentability dated Oct. 10, 2019 for the corresponding PCT Application No. PCT/JP2018/013532.
Office Action dated Jul. 13, 2021 for Chinese Application No. 201880021865.2, with English translation.
Office Action dated Nov. 24, 2021 for Taiwanese Application No. 107111431, with English translation.
International Search Report dated Jun. 12, 2018 for the corresponding PCT Application No. PCT/JP2018/013532.
Japanese Office Action dated Jan. 25, 2022, for the corresponding Japanese Patent Application No. 2019-510217, with English machine translation.
Japanese Office Action dated Oct. 4, 2022 for the corresponding Japanese Patent Application No. 2019-510217, with machine English translation.
Korean Office Action dated Oct. 11, 2022 for the corresponding Korean Patent Application No. 2019-7025817, with machine English translation.

* cited by examiner

*Primary Examiner* — Vickey Nerangis
(74) *Attorney, Agent, or Firm* — Michael Best & Friedrich LLP

(57) ABSTRACT

Provided is a curable resin composition for obtaining a cured product that can satisfy both high heat resistance and high adhesiveness to metal, a cured product thereof, and methods of producing the curable resin composition and the cured product, and a semiconductor device using the cured product as a sealant. A curable resin composition containing (A) a multifunctional benzoxazine compound having two or more benzoxazine rings, (B) a multifunctional epoxy compound having at least one norbornane structure and at least two epoxy groups, (C) a curing agent, (D) a triazole-based compound, and optionally (E) a curing accelerator and (F) an inorganic filler, a cured product thereof, and methods of producing the curable resin composition and the cured product. A semiconductor device in which a semiconductor element is disposed in a cured product obtained by curing a curable resin composition containing components (A) to (D), and optionally components (E) and (F).

13 Claims, No Drawings

COMPOSITION FOR CURABLE RESIN, CURED PRODUCT OF SAID COMPOSITION, METHOD OF PRODUCING SAID COMPOSITION AND SAID CURED PRODUCT, AND SEMICONDUCTOR DEVICE

CROSS-REFERENCE TO RELATED APPLICATIONS

This application is entering the National Phase of International Application No. PCT/JP2018/013532 filed on Mar. 30, 2018. Further, this application is based upon and claims the benefit of priority from Japanese Patent Application No. 2017-072648, filed on Mar. 31, 2017; the entire contents of which are incorporated herein by reference.

TECHNICAL FIELD

The present invention relates to a curable resin composition for obtaining a cured product excellent in adhesiveness to metal, a cured product thereof, and methods of producing the curable resin composition and the cured product. Furthermore, the present invention relates to a semiconductor device using the cured product as a sealant.

BACKGROUND ART

Curable resins are used in various applications of semiconductor sealants, fiber reinforced plastics, and the like, and benzoxazine compounds are used for one of raw materials of such resins.

Benzoxazine compounds refer to compounds each including a benzoxazine ring having a benzene backbone and an oxazine backbone, and benzoxazine resins as cured products (polymerized products) thereof are excellent in physical properties such as heat resistance and mechanical strength, and are used as high-performance materials in various applications.

Patent Document 1 discloses a novel benzoxazine compound having a specified structure, and a production method thereof, and describes the benzoxazine compound which has a high thermal conductivity and which enables a benzoxazine resin cured product having a high thermal conductivity to be produced.

Patent Document 2 discloses a thermosetting resin where a reactive end of a polybenzoxazine resin having a specified benzoxazine ring structure in a main chain is partially or fully closed, and describes the thermosetting resin which is excellent in storage stability in the case of being dissolved in a solvent.

RELATED ART DOCUMENTS

Patent Document

[Patent Document 1] JP 2013-60407 A
[Patent Document 2] JP 2012-36318 A

SUMMARY OF THE INVENTION

Problems to be Solved by the Invention

There is still a need for a resin cured product that is higher in heat resistance and higher in deformation resistance with maintaining strength so as to be adapted for more stringent usage conditions, in applications of, for example, matrix resins for adhesives, sealants, paints, and composites. There is further a need for a curable resin composition for obtaining a cured product that not only has such performances, but also is high in adhesiveness to metal, in applications of a semiconductor device and the like where much higher reliability is demanded.

However, there has not been obtained any curable resin composition for obtaining a cured product that can satisfy both excellent cured product performance and high adhesiveness.

Accordingly, an object of the present invention is to provide a curable resin composition for obtaining a cured product that can satisfy both high heat resistance and high adhesiveness as cured product performances. Another object of the present invention is to provide a cured product obtained by curing the curable resin composition, and methods of producing the curable resin composition and the cured product. Another object of the present invention is to provide a semiconductor device using the cured product as a sealant.

Means for Solving the Problems

The present inventors have made intensive studies in order to achieve the above objects, and as a result, have developed a curable resin composition containing a multifunctional benzoxazine compound, a multifunctional epoxy compound and a triazole-based compound, and have found that a cured product of the composition is excellent in heat resistance and adhesiveness to metal, thereby leading to completion of the present invention.

That is, the present invention is as follows.

[1] A curable resin composition containing:

(A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2);

(B) a multifunctional epoxy compound having at least one norbornane structure and at least two epoxy groups;

(C) a curing agent; and (D) a triazole-based compound;

[Chem 1]

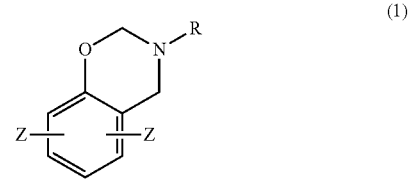

(1)

wherein in the formula (1), R represents an acyclic alkyl group having 1 to 12 carbon atoms, a cyclic alkyl group having 3 to 8 carbon atoms, or an aryl group having 6 to 14 carbon atoms, where the aryl group optionally has halogen or an acyclic alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

[Chem 2]

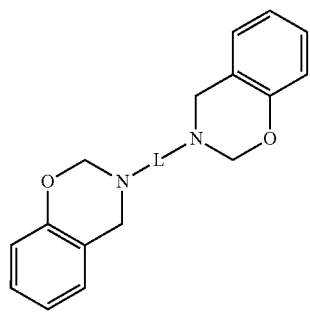

(2)

wherein in the formula (2), L represents a divalent organic group having 1 to 5 aromatic rings or an alkylene group having 2 to 10 carbon atoms, and the organic group and the alkylene group optionally comprise oxygen and/or sulfur.
[2] The curable resin composition according to [1], further containing (E) a curing accelerator.
[3] The curable resin composition according to [1] or [2], further containing (F) an inorganic filler.
[4] The curable resin composition according to any of [1] to [3], wherein the triazole-based compound (D) is a compound having a 1,2,4-triazole ring.
[5] The curable resin composition according to any of [1] to [4], wherein the triazole-based compound (D) is a compound represented by general formula (9-1):

[Chem 3]

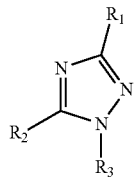

(9-1)

wherein $R_1$, $R_2$, and $R_3$ each independently represent a hydrogen atom, an amino group, a mercapto group, an alkyl group, an aryl group, or a carboxy group, and the alkyl group and the aryl group are optionally substituted, provided that at least one of $R_1$, $R_2$, and $R_3$ represents a mercapto group.
[6] The curable resin composition according to any of [1] to [5], wherein the triazole-based compound (D) is a compound represented by general formula (9-5):

[Chem 4]

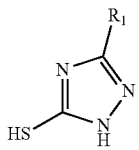

(9-5)

wherein $R_1$ represents a hydrogen atom or an amino group.
[7] The curable resin composition according to any of [1] to [6], wherein the compounding ratio of the triazole-based compound (D) is 0.1 to 30 parts by mass based on 100 parts by mass in total of (A), (B) and (C).
[8] A cured product obtained by curing the curable resin composition according to any of [1] to [7].
[9] A semiconductor device, wherein a semiconductor element is disposed in a cured product obtained by curing the curable resin composition according to any of [1] to [7].
[10] A method of producing a curable resin composition, the method comprising:

a step of mixing (A) a multifunctional benzoxazine compound having at least two benzoxazine rings, the compound being at least one multifunctional benzoxazine compound selected from a multifunctional benzoxazine compound having a structural unit of formula (1) and a multifunctional benzoxazine compound represented by a structure of formula (2), (B) a multifunctional epoxy compound having at least one norbornane structure and at least two epoxy groups, (C) a curing agent, and (D) a triazole-based compound to obtain a mixture; and a step of processing the mixture into a powdery, pelletized, or granular curable resin composition;

[Chem 5]

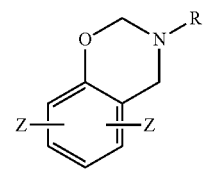

(1)

wherein in the formula (1), R represents an acyclic alkyl group having 1 to 12 carbon atoms, a cyclic alkyl group having 3 to 8 carbon atoms, or an aryl group having 6 to 14 carbon atoms, where the aryl group optionally has halogen or an acyclic alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

[Chem 6]

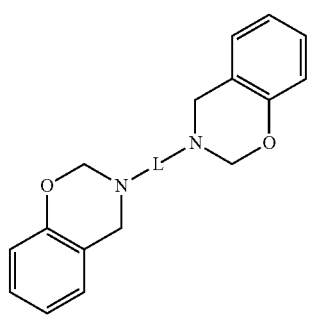

(2)

wherein in the formula (2), L represents a divalent organic group having 1 to 5 aromatic rings or an alkylene group having 2 to 10 carbon atoms, and the organic group and the alkylene group optionally comprise oxygen and/or sulfur.
[11] The production method according to [10], wherein the step of obtaining a mixture comprises further mixing (E) a curing accelerator and/or (F) an inorganic filler to obtain a mixture.
[12] A method of producing of a cured product, the method comprising
a step of heating the curable resin composition produced by the method according to [10] or [11] to 180 to 300° C. for curing.

Effects of the Invention

The curable resin composition of the present invention is a novel curable resin composition containing components (A) to (D), and further, if desired, components (E) and (F), and a cured product of the composition is characterized by being high in adhesiveness to metal, being favorable in heat resistance, being hardly pyrolyzed, and being high in glass transition temperature. Accordingly, the curable resin composition of the present invention can be used in an application where high adhesiveness to metal and high heat resistance are required, for example, applications of matrix resins for adhesives, sealants, paints, and composites. In particular, the curable resin composition not only can allow a semiconductor element sealant to exert excellent sealing performance, but also can contribute to high reliability of a semiconductor device.

The method of producing a cured product of the present invention can form a cured product that has excellent performances described above and that is applicable to the above applications, in a short time.

MODE FOR CARRYING OUT THE INVENTION

[Curable Resin Composition]
Hereinafter, the present invention will be described in detail. It is noted that each "compound" in components (A) and (B) in the present invention encompasses not only a monomer represented in each formula, but also an oligomer obtained by polymerization of a small amount of the monomer, namely, a prepolymer before formation of a curable resin.

(Component A)
The component (A) that constitutes the curable resin composition is at least one multifunctional benzoxazine compound having at least two benzoxazine rings, selected from a multifunctional benzoxazine compound having a structural unit of formula (1) and a multifunctional benzoxazine compound represented by a structure of formula (2). Herein, each Z in the formula (1) represents hydrogen, a substituent and/or a linking group (spacer), and is optionally the same or different, at least one Z represents a linking group, and benzoxazine rings are linked by the linking group. The linking group here encompasses two benzoxazine rings directly bound via no other group. Examples of the substituent include a hydrocarbon group having 1 to 8 carbon atoms.

Accordingly, the formula (1) represents the structural unit of any compound where two or more benzoxazine rings are linked at a benzene ring moiety, among options of the component (A).

The multifunctional benzoxazine compound of formula (1) can be more specifically represented as having a structure represented by formula (1a):

[Chem 7]

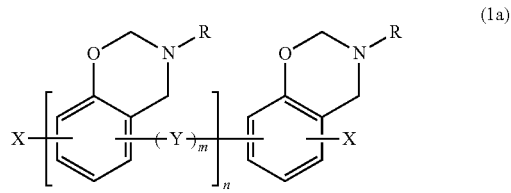

wherein in the formula (1a), R represents an acyclic alkyl group having 1 to 12 carbon atoms, a cyclic alkyl group having 3 to 8 carbon atoms, or an aryl group having 6 to 14 carbon atoms, where the aryl group optionally has halogen or an acyclic alkyl group having 1 to 12 carbon atoms, as a substituent; each R is optionally the same or different; each X represents hydrogen or a hydrocarbon group having 1 to 8 carbon atoms, and is optionally the same or different; Y represents an alkylene group having 1 to 6 carbon atoms, oxygen, sulfur, a $SO_2$ group, or a carbonyl group; m is 0 or 1; and n is an integer of 1 to 10.

Specific examples of R in formulae (1) and (1a) can include the following groups.

Examples of the linear alkyl group having 1 to 12 carbon atoms include a methyl group, an ethyl group, a propyl group, an isopropyl group, a n-butyl group, an isobutyl group, and a t-butyl group.

Examples of the cyclic alkyl group having 3 to 8 carbon atoms include a cyclopentyl group and a cyclohexyl group.

Examples of the aryl group having 6 to 14 carbon atoms include a phenyl group, a 1-naphthyl group, a 2-naphthyl group, a phenanthryl group, and a biphenyl group.

The aryl group having 6 to 14 carbon atoms is optionally substituted, and examples of the substituent include an acyclic alkyl group having 1 to 12 carbon atoms, or halogen. Examples of the aryl group having 6 to 14 carbon atoms, substituted with an acyclic alkyl group having 1 to 12 carbon atoms, or halogen include an o-tolyl group, a m-tolyl group, a p-tolyl group, a xylyl group, an o-ethylphenyl group, a m-ethylphenyl group, a p-ethylphenyl group, an o-t-butylphenyl group, a m-t-butylphenyl group, a p-t-butylphenyl group, an o-chlorophenyl group, and an o-bromophenyl group.

R is preferably selected from a methyl group, an ethyl group, a propyl group, a phenyl group, and a p-tolyl group from the viewpoint of favorable handleability.

The component (A) may also be a mixture of a plurality of kinds of compounds represented in formula (1) or (1a), which are different in R from each other.

Examples of the hydrocarbon group having 1 to 8 carbon atoms, of formulae (1) and (1a), include an alkyl group, an aryl group, and an aralkyl group, and an aryl group is preferable.

Examples of the multifunctional benzoxazine compound represented by formula (1) or (1a) can include a compound represented by the following formula (1x) and an oligomer obtained by polymerization of a small amount of the compound.

[Chem 8]
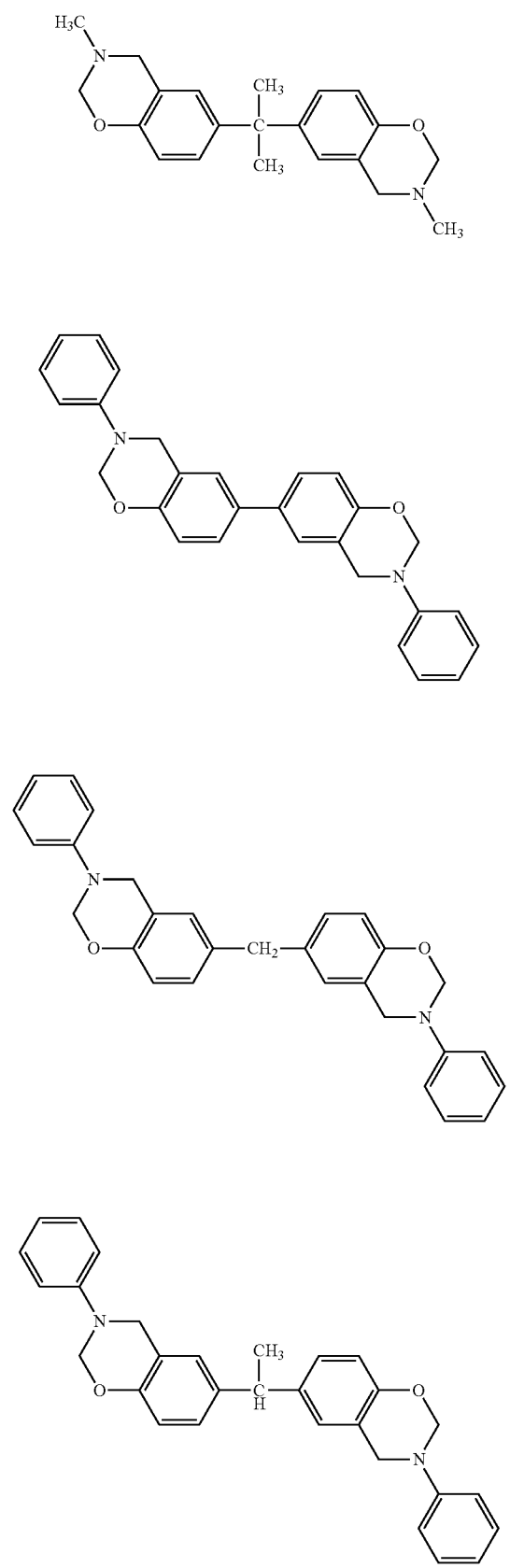

-continued

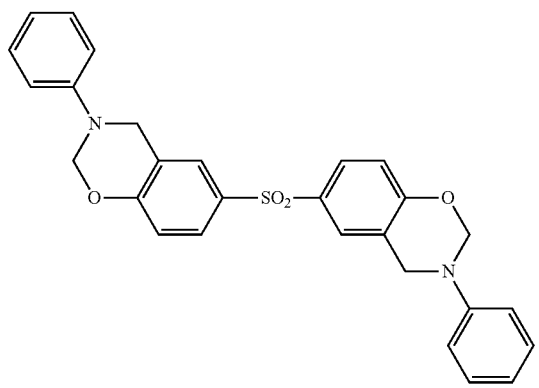
(1X)

The multifunctional benzoxazine compound of formula (2), as other option of the component (A), is a compound where respective nitrogen atoms (N atoms) in two benzoxazine rings are bound via a linking group L,

[Chem 9]

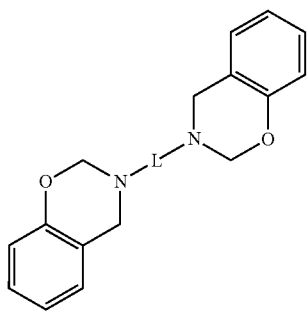
(2)

wherein in the formula (2), L represents a divalent organic group having 1 to 5 aromatic rings or an alkylene group having 2 to 10 carbon atoms, and the organic group and the alkylene group optionally comprise oxygen and/or sulfur.

The composition of the present invention may contain a plurality of kinds of multifunctional benzoxazine compounds represented by formula (2), which are different in L, in the component (A).

In the case where L in formula (2) represents an aromatic ring-containing group, the group contains 1 to 5 aromatic rings, and examples thereof include a monocyclic compound, a multicyclic compound, and a fused ring compound. L may also comprise at least one selected from the group consisting of oxygen and sulfur.

Specific examples can include a group represented by the following formula (3).

[Chem 10]

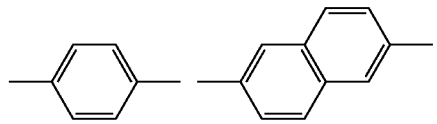
(3)

-continued

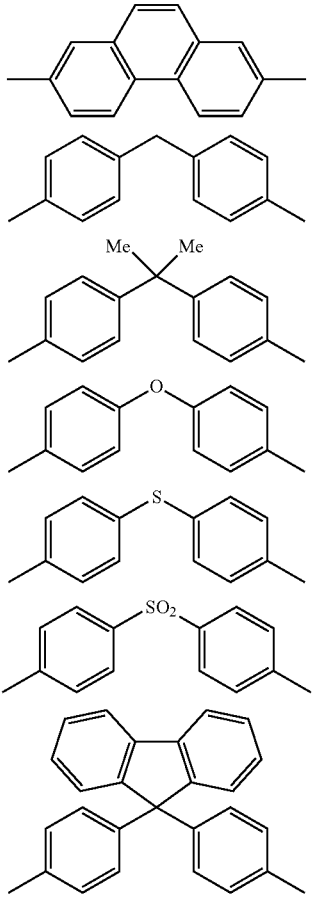

In the case where L in formula (2) represents an alkylene group, the alkylene group has, for example, 1 to 10 carbon atoms, preferably 1 to 6 carbon atoms. Specific examples of the alkylene group include a methylene group, an ethylene group, and an isopropylidene group, and preferably include a methylene group.

Examples of the multifunctional benzoxazine compound of formula (2) can include a compound represented by the following formula (2x), and an oligomer obtained by polymerization of the compound, for example, an oligomer obtained by polymerization of a small amount of the compound.

[Chem 11]

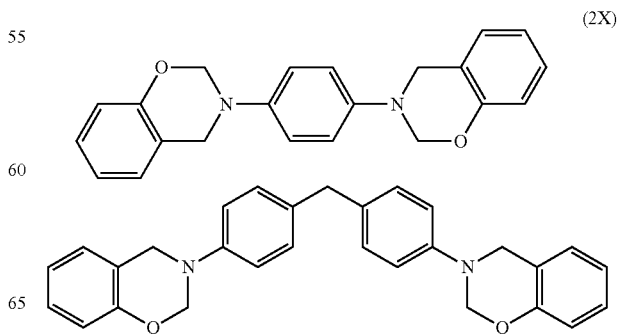
(2X)

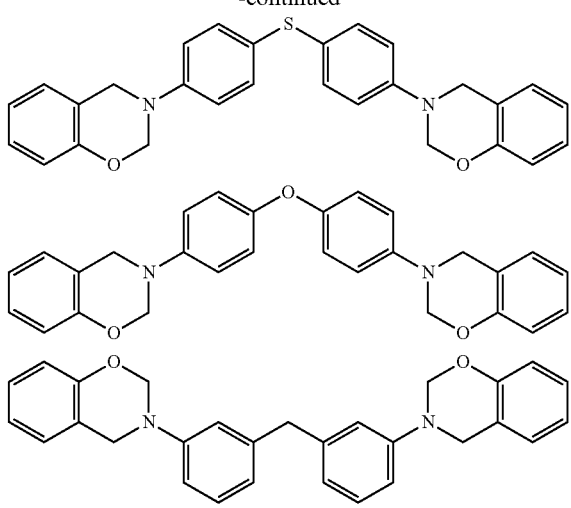

Any commercially available product can also be used as the multifunctional benzoxazine compound of the component (A). Examples of such any commercially available product can include bisphenol F-aniline (F-a)-type benzoxazine and phenol-diaminodiphenylmethane (P-d)-type benzoxazine (both are manufactured by SHIKOKU CHEMICALS CORPORATION).

(Component B)

The component (B) that constitutes the curable resin composition is a multifunctional epoxy compound having at least one norbornane structure and at least two epoxy groups (hereinafter, also simply referred to as "multifunctional epoxy compound"). The composition of the present invention may contain a plurality of kinds of the multifunctional epoxy compounds as the component (B). The multifunctional epoxy compound is preferably an alicyclic epoxy compound, more preferably has an epoxy structure represented by the following formula (4), bound to a 5-membered ring, a 6-membered ring or a norbornane ring.

[Chem 12]

(4)

Specific examples of the multifunctional epoxy compound can include a compound represented by the following formula (5).

[Chem 13]

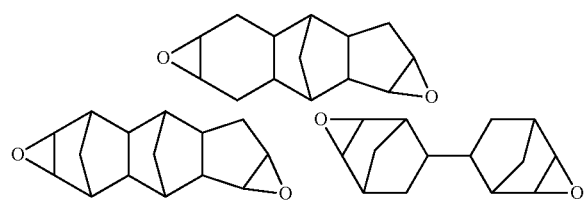

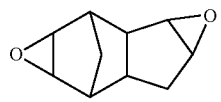

(5)

A production example of the multifunctional epoxy compound of the component (B) is described.

A compound of the following formula (5-1) can be produced by, for example, synthesizing a compound (a) having the following norbornane structure, by a Diels-Alder reaction of butadiene and dicyclopentadiene, and then reacting the compound (a) and meta-chloroperbenzoic acid, as represented in the following formula (6).

[Chem 14]

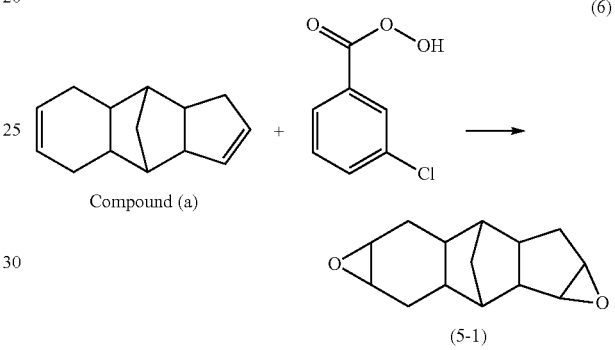

A compound of the following formula (5-2) can be produced by, for example, synthesizing a compound (b) (tricyclopentadiene) having the following norbornane structure, by a Diels-Alder reaction of cyclopentadiene and dicyclopentadiene, and then reacting the compound (b) and meta-chloroperbenzoic acid, as represented in the following formula (7).

[Chem 15]

A compound of the following formula (5-3) can be produced by, for example, synthesizing a compound (c) having the following norbornane structure, by a Diels-Alder reaction of butadiene and cyclopentadiene, and then reacting the compound (c) and meta-chloroperbenzoic acid, as represented in the following formula (8).

[Chem 16]

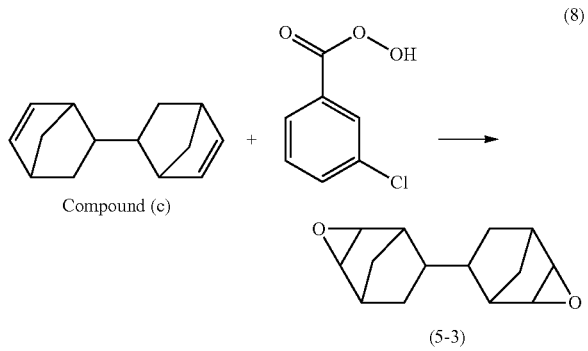

A compound of the following formula (5-4) can be produced by, for example, reacting dicyclopentadiene and potassium peroxymonosulfate (oxone). The compound of formula (5-4), dicyclopentadiene diepoxide, may also be any commercially available product, and examples of such any commercially available product can include dicyclopentadiene diepoxide manufactured by SHANDONG QIHUAN BIOCHEMICAL CO., LTD.

[Chem 17]

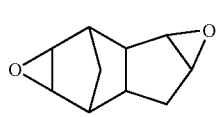

The compounding ratio between the multifunctional benzoxazine compound of the component (A) and the multifunctional epoxy compound of the component (B) is preferably 5 parts by mass or more and 150 parts by mass or less, more preferably 10 parts by mass or more and 100 parts by mass or less, in terms of the compounding ratio of the component (B) based on 100 parts by mass of the component (A). The compounding ratio between the components (A) and (B) can be in the above range, thereby allowing favorable heat resistance to be obtained.

In the case where the composition of the present invention contains a plurality of kinds of the multifunctional benzoxazine compounds as the component (A), the total of such compounds is assumed to be 100 parts by mass. In the case where the composition of the present invention contains a plurality of kinds of the multifunctional epoxy compounds in the component (B), the "compounding ratio of the component (B)" means the total ratio of such a plurality of compounds.

(Component C)

The component (C) that constitutes the curable resin composition is a curing agent. The composition of the present invention preferably contains at least one curing agent selected from imidazoles, aromatic amines, and multifunctional phenols, as the component (C). Examples of the component (C) include aromatic amines (for example, diethyltoluenediamine, metaphenylenediamine, diaminodiphenylmethane, diaminodiphenylsulfone, metaxylenediamine, and derivatives thereof), aliphatic amines (for example, triethylenetetramine and isophoronediamine), imidazoles (for example, imidazole and imidazole derivatives), dicyandiamide, tetramethylguanidine, carboxylic anhydrides (for example, methylhexahydrophthalic anhydride), carboxylic acid hydrazides (for example, adipic acid hydrazide), carboxylic acid amides, monofunctional phenols, multifunctional phenols (for example, bisphenol A, bisphenol F, bisphenol sulfides (for example, bis(4-hydroxyphenyl)sulfide), and a polyphenol compound), polymercaptans, carboxylates, and Lewis acid complexes (for example, boron trifluoride ethylamine complex). These may be used singly or as a mixture of two or more kinds thereof.

The compounding ratio of the component (C) is preferably in a range of 1 part by mass or more and 30 parts by mass or less, more preferably in a range of 5 parts by mass or more and 25 parts by mass or less, in terms the compounding ratio of the component (C) based on 100 parts by mass in total of the components (A) and (B). The component (C) can be contained in such a range, thereby allowing for efficient progression of a curing reaction, and obtaining a cured product high in heat resistance.

(Component D)

The triazole-based compound (D) for use in the present invention is a compound having a five-membered ring structure including a nitrogen atom. The triazole-based compound can improve affinity of the resin composition with the surface of metal to thereby enhance adhesiveness of the resin to metal, and thus plays a role in improvements in moisture-resistant reliability and solder cracking resistance of a semiconductor device obtained by sealing a semiconductor element with a cured product of the resin composition. Accordingly, reliability of the semiconductor device is enhanced.

Examples of the triazole-based compound for use in the present invention include a compound having a 1,2,4-triazole ring and a compound having a 1,2,3-triazole ring, and specific examples thereof include compounds represented by the following formulae (9-1) to (9-4):

[Chem 18]

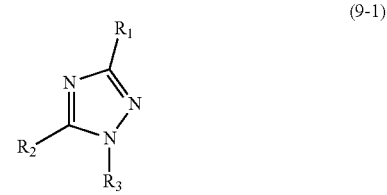

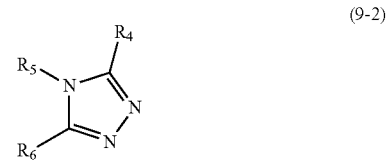

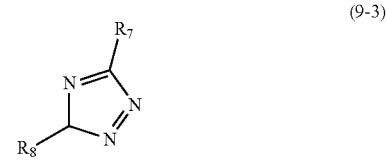

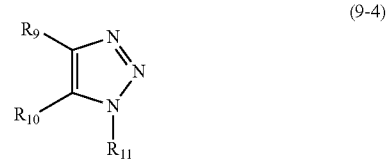

wherein $R_1$, $R_2$, $R_3$, $R_4$, $R_5$, $R_6$, $R_7$, $R_8$, $R_9$, $R_{10}$, and $R_{11}$ each independently represent a hydrogen atom, an amino group, a mercapto group, an alkyl group, an aryl group, or a carboxy group, where the alkyl group and the aryl group are optionally substituted.

The alkyl group represented by $R_1$, $R_2$, $R_3$, $R_4$, $R_5$, $R_6$, $R_7$, $R_8$, $R_9$, $R_{10}$, or $R_{11}$ in formulae (9-1) to (9-4) in the present invention is not particularly limited in terms of the number of carbon atoms, and preferably has 1 to 6 carbon atoms. The alkyl group is optionally substituted, and is preferably optionally substituted with an ester group, an amide group, an aryl group, a halogen atom, or the like. The alkyl group may have a straight chain, a branched chain or a cyclic structure, or a combination thereof.

Specific examples of the alkyl group represented by $R_1$, $R_2$, $R_3$, $R_4$, $R_5$, $R_6$, $R_7$, $R_8$, $R_9$, $R_{10}$, or $R_{11}$ include a methyl group, an ethyl group, a n-propyl group, an i-propyl group, a n-butyl group, an i-butyl group, a s-butyl group, a t-butyl group, a cyclohexyl group, and a benzyl group, and preferably include a methyl group and an i-propyl group.

The aryl group represented by $R_1$, $R_2$, $R_3$, $R_4$, $R_5$, $R_6$, $R_7$, $R_8$, $R_9$, $R_{10}$, or $R_{11}$ in formulae (9-1) to (9-4) herein is not particularly limited in terms of the number of carbon atoms, and preferably has 6 to 10 carbon atoms. The aryl group here is optionally substituted, and is preferably optionally substituted with an alkyl group or the like.

Specific examples of the aryl group represented by $R_1$, $R_2$, $R_3$, $R_4$, $R_5$, $R_6$, $R_7$, $R_8$, $R_9$, $R_{10}$, or $R_{11}$ include a phenyl group, a naphthyl group, and a tolyl group, and preferably include a phenyl group and a tolyl group.

Specific examples of the triazole-based compound for use in the present invention include the following compounds.

[Chem 19]

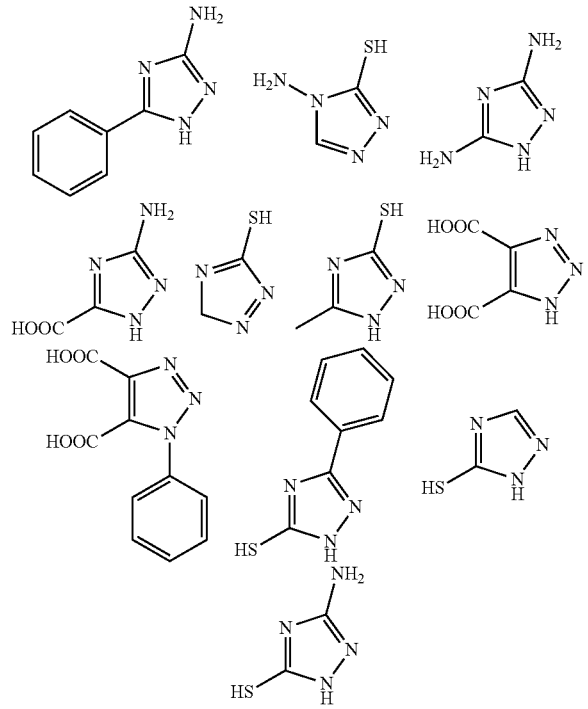

According to a preferable embodiment of the present invention, at least one of $R_1$, $R_2$, and $R_3$ in formula (9-1) represents a mercapto group. According to another preferable embodiment of the present invention, at least one of $R_4$, $R_5$, and $R_6$ in formula (9-2) represents a mercapto group. According to another preferable embodiment of the present invention, at least one of $R_7$ and $R_8$ in formula (9-3) represents a mercapto group. According to another preferable embodiment of the present invention, at least one of $R_9$, $R_{10}$, and $R_{11}$ in formula (9-4) represents a mercapto group.

The triazole-based compound (D) in the preferable embodiment necessarily includes a mercapto group. The mercapto group has reactivity with metal (for example, copper, silver, and gold plating). Accordingly, high adhesiveness can be realized even in formation of a cured product on a metal frame, and thus a semiconductor device can be enhanced in reliability due to sealing thereof by use of a cured product of the curable resin composition including the triazole-based compound (D).

According to another preferable embodiment of the present invention, the triazole-based compound for use in the present invention is represented by formula (9-1) in which $R_1$ represents a hydrogen atom, an amino group, a mercapto group, an alkyl group, an aryl group, or a carboxy group, the alkyl group and the aryl group being optionally substituted, $R_2$ represents a mercapto group and $R_3$ represents a hydrogen atom. The triazole-based compound is represented by formula (9-5).

[Chem 20]

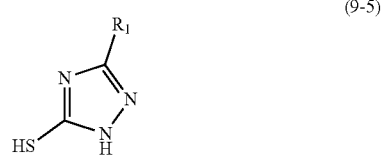

(9-5)

According to another more preferable embodiment of the present invention, $R_1$ in formula (9-5) represents a hydrogen atom or an amino group. Specific examples include the following compounds.

[Chem 21]

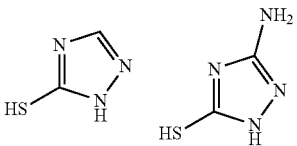

The compounding ratio of the triazole-based compound (D) for use in the present invention is not particularly limited, and is preferably 0.1 to 30 parts by mass based on 100 parts by mass in total of the components (A), (B) and (C), from the viewpoint of adhesiveness of a cured product to metal. The compounding ratio of the triazole-based compound is more preferably 0.1 to 25 parts by mass based on 100 parts by mass in total of the components (A), (B) and (C), and can be in such a range, thereby imparting favorable fluidity in thermal formation of a cured product, allowing adhesiveness of a cured product to metal and fluidity of the composition to be satisfied in a well-balanced manner, and allowing reliability of a package to be favorably retained.

(Component E)

The curable resin composition of the present invention may further contain, if desired, (E) a curing accelerator. A known curing accelerator can be used as the curing accelerator, and examples include amine-based compounds such as tributylamine and 1,8-diazabicyclo(5,4,0)undecene-7, imidazole-based compounds such as 2-methylimidazole, 2-ethylimidazole and 1,2-dimethylimidazole, and phosphororganic compounds including phosphororganic compounds with phosphorus bound by only a covalent bond, such as triphenylphosphine, and salt-type phosphororganic compounds with phosphorus bound by a covalent bond and an ionic bond, such as tetraphenylphosphonium tetraphenylborate, but are not limited thereto. The above curing accelerators may be used singly or in combination of two or more kinds thereof. In particular, phosphororganic compounds such as triphenylphosphine and tetraphenylphosphonium tetraphenylborate exert a high effect of enhancing the speed of curing and thus are preferable.

Such a phosphororganic compound described above exerts a function of promoting a crosslinking reaction of an epoxy group and a phenolic hydroxyl group, as described in JP-A 55-157594. Furthermore, such a phosphororganic compound described above also exerts a function of promoting a reaction of a hydroxyl group and an epoxy group generated in a cleavage reaction of the multifunctional benzoxazine compound (A) at high temperatures. The phosphororganic compound in the present invention is not particularly limited as long as it has the above functions.

The compounding ratio of the component (E) is preferably in a range of 0.01 parts by mass or more and 10 parts by mass or less in terms of the compounding ratio of the component (E) based on 100 parts by mass in total of the components (A) and (B). The ratio is more preferably in a range of 0.1 parts by mass or more and 7 parts by mass or less. The component (E) can be contained in such a range, thereby providing a curable resin composition having favorable fast curability.

(Component F)

The curable resin composition of the present invention may further contain, if desired, (F) an inorganic filler. For example, in the case of use of the curable resin composition of the present invention in a sealant application of a semiconductor element or the like, the component (F) is preferably contained. The inorganic filler for use in the present invention is not particularly limited, and can be selected in consideration of an application of the composition or a cured product thereof, or characteristics to be provided. Hereinafter, the inorganic filler is referred to as "component (F)".

Examples of the component (F) include oxides such as silica, alumina, titanium oxide, zirconium oxide, magnesium oxide, cerium oxide, yttrium oxide, calcium oxide, antimony trioxide, zinc oxide and iron oxide; carbonates such as calcium carbonate, magnesium carbonate, barium carbonate and strontium carbonate; sulfates such as barium sulfate, aluminum sulfate and calcium sulfate; nitrides such as aluminum nitride, silicon nitride, titanium nitride, boron nitride and manganese nitride; silicon compounds such as calcium silicate, magnesium silicate and aluminum silicate; boron compounds such as aluminum borate; zirconium compounds such as barium zirconate and calcium zirconate; phosphorus compounds such as zirconium phosphate and magnesium phosphate; titanium compounds such as strontium titanate, calcium titanate, magnesium titanate, bismuth titanate, barium titanate and potassium titanate; minerals such as mica, talc, kaolin, kaolin clay, kaolinite, halloysite, cordierite, pyrophyllite, montmorillonite, sericite, amesite, bentonite, asbestos, wollastonite, sepiolite, zonolite, zeolite, hydrotalcite, hydrated gypsum, alum, diatomaceous earth and boehmite; fly ash, dewatered sludge, glass beads, glass fibers, silica sand, magnesium oxysulfate, silicon oxide, and silicon carbide; metals such as copper, iron, cobalt and nickel, or alloys including any of such metals; magnetic materials such as sendust, alnico magnet and ferrite; and graphite and coke. The component (F) is preferably silica or alumina. Examples of the silica include molten silica, spherical silica, crystalline silica, amorphous silica, synthetic silica and hollow silica, and, in particular, spherical silica and crystalline silica are preferable. The component (F) may be used singly or in combination of two or more kinds thereof. The component (F) may be particulate, and in such a case, the average particle size is not particularly limited, and may be, for example, 0.01 μm or more and 150 μm or less, preferably 0.1 μm or more and 120 μm or less, more preferably 0.5 μm or more and 75 μm or less. Such a range leads to an improvement in packing ability into a mold cavity in use of the composition of the present invention in, for example, a sealant application of a semiconductor element. The average particle size of the component (F) can be measured by a laser diffraction/scattering method. Specifically, the average particle size can be determined by creating the particle size distribution of the inorganic filler on a volume basis, with a laser diffraction-type particle size distribution measuring apparatus, and defining the median size as the average particle size. A measurement sample that can be here used is preferably obtained by ultrasonically dispersing the inorganic filler in water. The laser diffraction-type particle size distribution measuring apparatus that can be here used is, for example, "LA-500", "LA-750", "LA-950" or "LA-960" manufactured by HORIBA LTD.

The compounding ratio of the component (F) is not particularly limited and can be appropriately selected depending on its application as long as a cured product of the curable resin composition, high in heat resistance, is obtained. For example, in the case of use of the composition in a semiconductor-sealing application, the following compounding ratio is preferable.

The lower limit value of the compounding ratio of the component (F) is, for example, 150 parts by weight or more, preferably 400 parts by weight or more, more preferably 500 parts by weight or more, based on 100 parts by mass in total of the components (A), (B), (C) and (D). The upper limit value of the compounding ratio of the component (F) is, for example, 1300 parts by weight or less, preferably 1150 parts by weight or less, more preferably 950 parts by weight or less. The lower limit value of the compounding ratio of the component (F) is 400 parts by weight or more, thereby enabling an increase in amount of moisture absorption and a reduction in strength according to curing of the curable resin composition to be suppressed, and thus enabling a cured product having favorable solder cracking resistance to be obtained. The upper limit value of the compounding ratio of the component (F) is 1300 parts by weight or less, thereby allowing the curable resin composition to have fluidity and thus be easily packed into a mold, resulting in exertion of favorable sealing performance of a cured product.

(Other Component(s))

The composition of the present invention may contain a benzoxazine compound other than the component (A) as long as the effects of the present invention are not impaired. For example, in the case where the composition is demanded to be reduced in viscosity, a monofunctional benzoxazine compound having one benzoxazine ring may be added to the composition.

For example, nano-carbon, a flame retardant, and/or a release agent can be compounded into the curable resin composition of the present invention as long as performances of the curable resin composition are not impaired.

Examples of the nano-carbon include carbon nanotube, fullerene or respective derivatives.

Examples of the flame retardant include red phosphorus, phosphates such as triphenyl phosphate, tricresyl phosphate, trixylenyl phosphate, cresyl diphenyl phosphate, xylenyl diphenyl phosphate, resorcinol bis-phenyl phosphate, bisphenol A bis-diphenyl phosphate, and borates.

Examples of the release agent include silicone oil, stearate, and carnauba wax.

In the case where the curable resin composition of the present invention is used in a semiconductor-sealing application, one or more of colorants such as carbon black, colcothar and titanium oxide; release agents including natural waxes such as carnauba wax, synthetic waxes such as oxidized polyethylene wax, higher fatty acids such as stearic acid, metal salts such as zinc stearate, and paraffin; low-stress additives such as silicone oil and silicone rubber; and flame retardants including metal hydroxides such as calcium hydroxide, aluminum hydroxide and magnesium hydroxide, and phosphazen, other than the components (A) to (F), may be appropriately compounded as long as performances of the curable resin composition are not impaired.

The compounding ratio of such other component(s) is preferably in a range of 0.01 parts by mass or more and 15 parts by mass or less, more preferably in a range of 0.1 parts by mass or more and 10 parts by mass or less in terms of the compounding ratio of such other component(s) based on 100 parts by mass in total of the components (A) and (B).

[Method of Producing Curable Resin Composition]

Next, the method of producing the curable resin composition of the present invention is described.

The curable resin composition of the present invention can be produced by mixing the components (A) to (D), and further, if desired, the components (E) to (F), other component(s) such as other additive(s), and a solvent, which are appropriately added, in a kneading or mixing apparatus.

The kneading or mixing method is not particularly limited, and the mixing can be made using, for example, a kneading machine such as a planetary mixer, a twin-screw extruder, a heat roll or a kneader. For example, in the case where the components (A) and (B) are highly viscous liquids or solids at room temperature and/or in the case where the component (F) is contained, if necessary, heating and kneading may be made or kneading may be made under a pressure or reduced pressure condition. The heating temperature is preferably 80 to 120° C.

The curable resin composition, which includes the component (F), is a solid at room temperature, and thus may be heated and kneaded, and thereafter cooled and pulverized to provide a powder, or the powder may be tabletted and thus formed into a pellet. The powder may also be granulated and thus formed into a granule.

In the case where the curable resin composition of the present invention, which does not contain any component (F), is used in an application of prepreg for FRP, the curable resin composition preferably has a viscosity of 10 to 3000 Pa·s at 50° C. The viscosity is more preferably 10 to 2500 Pa·s, further preferably 100 to 2000 Pa·s. In the case where the curable resin composition of the present invention is used in a sealant or coating application, the viscosity is not particularly limited as long as working such as sealing or coating is not impaired.

(Characteristics of Curable Resin Composition)

The fluidity of the curable resin composition of the present invention can be evaluated by spiral flow measurement. The spiral flow is, for example, 75 cm or more, preferably 80 cm or more, more preferably 90 cm or more. The spiral flow can be simply measured by use of a mold for spiral flow measurement, according to EMMI-1-66 ("Method of Test for Spiral Flow", The Society of Plastics Industry, Inc., New York, N.Y. (1966)).

[Cured Product]

The cured product of the curable resin composition of the present invention is characterized by being favorable in heat resistance, being hardly pyrolyzed, being high in glass transition temperature, and being high in adhesiveness to metal. The reason why such an excellent cured product is formed by the curable resin composition of the present invention is considered as follows.

It is considered that a phenolic hydroxyl group is first produced by polymerization in homopolymerization of benzoxazine and the phenolic hydroxyl group undergoes a keto-enol tautomer at a high temperature, for example, 200° C. or more, thereby resulting in cleavage of a polymer chain, and thus causing lower heat resistance and also a lower glass transition temperature.

On the contrary, it is considered that the multifunctional epoxy compound having a norbornane structure and two or more epoxy groups, in the present invention, is hardly homopolymerized and reacts with the phenolic hydroxyl group derived from benzoxazine to thereby prevent the cleavage of a polymer chain. Accordingly, a cured product high in heat resistance is obtained.

It is further considered that the component (D) has both the interaction with the surface of metal and the reactivity with the epoxy compound (B) and thus can enhance adhesiveness of the cured product and metal.

(Characteristics of Cured Product)

The heat resistance of the cured product of the present invention can be evaluated by measuring the glass transition temperature. The glass transition temperature is, for example, 200° C. or more, preferably 210° C. or more, more preferably 240° C. or more. The glass transition temperature can be measured by differential scanning calorimetry (DSC). Such measurement can be simply performed by use of a commercially available differential scanning calorimeter (for example, manufactured by Hitachi High-Tech Science Corporation).

The adhesion strength of the cured product of the present invention can be evaluated by measuring shear strength. The shear strength is, for example, 20 N/mm² or more, preferably 22 N/mm² or more, more preferably 23 N/mm² or more. The shear strength can be measured by an automatic shear-strength measuring device. Such measurement can be simply performed by use of a commercially available automatic shear-strength measuring device (for example, trade name: Dage Series 4000, manufactured by Nordson Advanced Technology. K.K.).

[Method of Producing Cured Product]

The cured product of the present invention can be produced by performing ring-opening polymerization for curing in the same curing conditions as in known benzoxazine compound and/or epoxy compound. Examples can include the following method.

The cured product can be obtained by first producing the curable resin composition of the present invention by the above method, and subsequently heating the resulting curable resin composition at 180 to 300° C. for 1 minute to 1 hour or 1 minute to 5 hours. While a treatment for a curing time of 1 to 3 minutes or 1 to 6 minutes is sufficient for continuous production of the cured product, further heating for about 5 minutes to 1 hour or about 5 minutes to 5 hours is preferable for achievement of higher strength.

The cured product can also be obtained by compounding a benzoxazine compound other than the component (A) and/or an epoxy compound other than the component (B), as long as the effects of the present invention are not impaired.

In the case where a film-shaped molded product is obtained as the cured product, a solvent can also be compounded to provide a composition which has a suitable viscosity for film formation. The solvent is not particularly limited as long as it can dissolve the components (A) to (E), and examples thereof include hydrocarbons, ethers, esters and halogen-containing solvents.

In the case of such a solution-type curable resin composition dissolved in the solvent, the cured product can be obtained by coating a substrate with the solution-type curable resin composition, thereafter volatilizing the solvent, and then performing thermal curing.

[Semiconductor Device]

The semiconductor device of the present invention is a semiconductor device where a semiconductor element is disposed in a cured product obtained by curing the curable resin composition of the present invention, the composition containing the components (A) to (D), and, if desired, the components (E) and (F). The semiconductor element is here usually supported and secured by a lead frame being a thin plate of a metallic material. The phrase "semiconductor element is disposed in a cured product" means that the semiconductor element is sealed by a cured product of the curable resin composition, and represents the state where the semiconductor element is covered with the cured product. In such a case, the entire semiconductor element may be covered, or the surface of the semiconductor element disposed on a base plate may be covered.

In the case where the semiconductor device is produced by sealing various electronic components such as a semiconductor element with the cured product of the present invention, the semiconductor device can be produced by performing a sealing step according to a conventional molding method such as transfer molding, compression molding, or injection molding.

EXAMPLES

Hereinafter, the present invention will be specifically described with reference to Examples and Comparative Examples, the present invention is not intended to be limited to such Examples.

<Component (A); Multifunctional Benzoxazine Compound>

The following was used as the component (A).

(A); Phenol-diaminodiphenylmethane (P-d)-type benzoxazine represented by the following formula (2-1) (manufactured by SHIKOKU CHEMICALS CORPORATION)

[Chem 22]

(2-1)

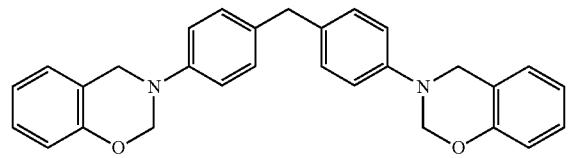

<Component (B) or (BC); Multifunctional Epoxy Compound>

The following (B1) to (B3) were used as the component (B).

(B1); Compound of Formula (5-1)

The compound (a) represented in formula (6) was synthesized according to a method described in "Shoichi Tsuchida et al., "Diels-Alder Reaction between Butadiene and Cyclopentadiene—Determination of Trimers-", Journal of the Japan Petroleum Institute, 1972, Vol. 15, Issue 3, pages 189 to 192".

Next, the reaction of formula (6) was performed as follows. A reaction vessel was charged with 23.5 kg of chloroform and 1.6 kg of the compound (a), and 4.5 kg of meta-chloroperbenzoic acid was dropped thereto with stirring at 0° C. The temperature was raised to room temperature, and the reaction was performed for 12 hours.

Next, meta-chlorobenzoic acid as a by-product was removed by filtration, and thereafter the filtrate was washed with an aqueous 1 N sodium hydroxide solution three times and then washed with saturated saline. After the organic layer was dried over magnesium sulfate, the magnesium sulfate was removed by filtration and the filtrate was concentrated, thereby obtaining a crude product.

To the crude product was added 2 kg of toluene, and dissolved at room temperature. Thereto was dropped 6 kg of heptane for crystallization, and the resultant was aged at 5° C. for 1 hour. A crystallized product was collected by filtration and washed with hexane. The product was dried under reduced pressure at 35° C. for 24 hours, thereby obtaining 1.4 kg of a compound represented by the following formula (5-1), as a white solid.

[Chem 23]

(5-1)

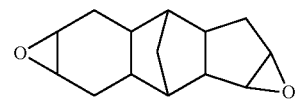

(B2); Compound of Formula (5-2) (Tricyclopentadiene Diepoxide)

The compound (b) was synthesized as in the compound (a), according to the method described in the above Document.

Next, the reaction of formula (7) was performed as follows. A reaction vessel was charged with 59.2 kg of chloroform and 4.0 kg of the compound (b), and 10.6 kg of meta-chloroperbenzoic acid was dropped thereto with stirring at −10° C. The temperature was raised to room temperature, and the reaction was performed for 12 hours.

Next, meta-chlorobenzoic acid as a by-product was removed by filtration, and thereafter the filtrate was washed with 42.0 kg of an aqueous 5% sodium sulfite solution. The organic layer was further washed with 41.6 kg of an aqueous 1 N sodium hydroxide solution four times, and thereafter washed with 48.0 kg of saturated saline. After the organic layer was dried over magnesium sulfate, the magnesium sulfate was removed by filtration and the filtrate was concentrated, thereby obtaining 5.1 kg of a crude product.

To the crude product was added 3.5 kg of toluene, and dissolved at room temperature. Thereto was dropped 13.7 kg of heptane for crystallization, and the resultant was aged at 5° C. for 1 hour. A crystallized product was collected by filtration and washed with heptane. The product was dried under reduced pressure at 35° C. for 12 hours, thereby obtaining 2.8 kg of a compound represented by the following formula (5-2), as a white solid.

[Chem 24]

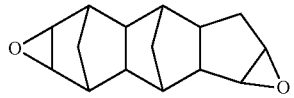

(5-2)

(B3); Compound of Formula (5-4) (Dicyclopentadiene Diepoxide)

After a reaction vessel was charged with 10 kg of dicyclopentadiene, 68 kg of sodium bicarbonate, 100 L of acetone and 130 L of ion exchange water, and cooled to 10° C. or less, cooling was controlled so that the temperature of the reaction liquid was kept at 30° C. or less, and 84 kg of oxone was gradually added and the reaction was performed with stirring for 10 hours.

Next, the reaction product was extracted with 100 L of ethyl acetate twice, and the resulting organic layers were fractionated and combined. Subsequently, the organic layer combined was washed with 100 L of a mixed aqueous solution of saline and sodium thiosulfate (20% by weight of saline+20% by weight of sodium thiosulfate), and thereafter further washed with 100 L of ion exchange water twice.

After the organic layer washed was dried over magnesium sulfate, the magnesium sulfate was removed by filtration, and the organic solvent was distilled off from the filtrate, thereby obtaining 11 kg of a compound represented by the following formula (5-4), as a white solid.

[Chem 25]

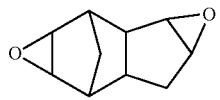

(5-4)

The following component (BC) having no norbornane structure was used as (BC) a multifunctional epoxy compound for Comparative Examples.

(BC); Multifunctional Epoxy Compound Represented by the Following Formula (10) (YX-4000H, Manufactured by Mitsubishi Chemical Corporation)

[Chem 26]

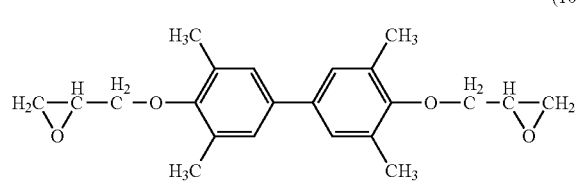

(10)

<Component (C); Curing Agent>

The following was used as the component (C).

(C); Bis(4-Hydroxyphenyl)Sulfide (TDP) Represented by the Following Formula (11) (Manufactured by TOKYO CHEMICAL INDUSTRY CO., LTD.)

[Chem 27]

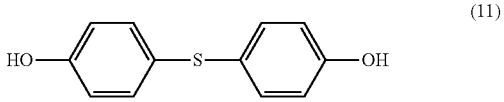

(11)

<Component (D); Triazole-Based Compound>

The following (D1) and (D2) were used as the component (D).

(D1); 1,2,4-Triazole-5-Thiol Represented by the Following Formula (12) (Manufactured by NIPPON CARBIDE INDESTRIES CO., INC.)

[Chem 28]

(12)

(D2); 3-Amino-1,2,4-Triazole-5-Thiol Represented by the Following Formula (13) (Manufactured by NIPPON CARBIDE INDESTRIES CO., INC.)

[Chem 29]

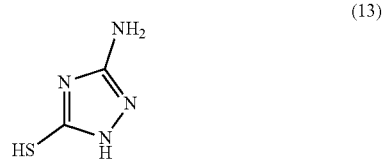

(13)

<Component (E); Curing Accelerator>

The following was used as the component (E).

(E); Triphenylphosphine (TPP) (Manufactured by HOKKO CHEMICAL INDUSTRY CO., LTD.)

<Component (F); Inorganic Filler>

A molten spherical silica (FB-820, manufactured by Denka Company Limited.) having an average particle size D50 of 22 μm was used as the component (F). Hereinafter, the silica is referred to as "(F)".

<Other Components>

Carnauba wax (manufactured by Clariant Japan K.K.) as a release agent and carbon black (MA600, manufactured by Mitsubishi Chemical Corporation) as a colorant were used.

Example 1

A curable resin composition (hereinafter, simply referred to as "composition") and a cured product were prepared as follows, and the spiral flow for fluidity evaluation, the shear strength for adhesion strength evaluation, and the glass transition temperature for heat resistance evaluation were measured.

After (A), (B1), (C), (D1), (E), (F), carnauba wax, and carbon black were kneaded at a compounding ratio shown in Table 1, by use of a heat roll kneader including respective two rolls having surface temperatures of 90° C. and 100° C. (BR-150HCV, AIMEX CO., Ltd.), under atmospheric pressure for 10 minutes, the resultant was cooled to room temperature to obtain a mixture. The mixture was pulverized for powdering by Mini Speed Mill MS-09 (manufactured by Labonect Co., Ltd.) so that packing into a mold was favorably performed, thereby obtaining a composition.

<Spiral Flow>

A mold for spiral flow measurement according to EMMI-1-66 ("Method of Test for Spiral Flow", The Society of Plastics Industry, Inc., New York, N.Y. (1966)) was used to measure the flow length of the curable resin composition at a mold temperature of 200° C. and a pressure of 70 kgf/cm$^2$ for a molding time of 180 seconds.

<Adhesion Strength>

A transfer molding machine (ADM-5, MEIHO CO., LTD.) was used to form twelve adhesion strength test pieces of 3 mm diameter×4 mm, per level, on a copper lead frame in conditions of a mold temperature of 200° C., an injection pressure of 9.8 MPa and a curing time of 6 minutes. Thereafter, an automatic shear-strength measuring device (Dage Series 4000, manufactured by Nordson Advanced Technology K.K.) was used to measure the shear strength of the cured product of the curable resin composition and the copper lead frame. Specifically, conditions of the automatic shear-strength measuring device were set to a head height of 100 μm and a head speed of 10 μm/sec. The average value of the shear strength, with respect to the twelve test pieces, was presented.

<Glass Transition Temperature; Tg>

A transfer molding machine was used to cure the composition prepared, in conditions of a mold temperature of 200° C., an injection pressure of 4 MPa and a curing time of 6 minutes, and the resultant was subjected to heating as a post-curing treatment in an oven at 240° C. for 4 hours, thereby producing a cured product of 3 mm length×3 mm width×15 mm height. The cured product was cut to provide a test piece having a size of 3 mm length×3 mm width×2 mm height, and the test piece was used to measure Tg by DSC in the following conditions. The results are shown in Table 1.

Apparatus: X-DSC-7000 (manufactured by Hitachi High-Tech Science Corporation)

Measurement conditions: flow rate of N$_2$; 20 mL/min, rate of temperature rise; 20° C./min Examples 2 to 7

Each composition of Examples was prepared in the same manner as in Example 1 except that the compounding ratio of each of the components was as shown in Table 1. Such each composition was subjected to measurement in the same manner as in Example 1 with respect to spiral flow, adhesion strength, and heat resistance (glass transition temperature). The results are shown in Table 1.

Comparative Examples 1 to 4

Each composition of Comparative Examples was prepared in the same manner as in Example 1 except that the compounding ratio of each of the components was as shown in Table 2. Such each composition was subjected to measurement in the same manner as in Example 1 with respect to spiral flow, adhesion strength, and heat resistance (glass transition temperature). The results are shown in Table 2.

TABLE 1

| | | | Example 1 | Example 2 | Example 3 | Example 4 | Example 5 | Example 6 | Example 7 |
|---|---|---|---|---|---|---|---|---|---|
| Component (parts by mass) | Multifunctional benzoxazine compound | (A) | 7.5 | 7.5 | 7.5 | 7.5 | 7.0 | 6.5 | 6.0 |
| | Multifunctional epoxy resin 1 | (B1) | 4.3 | 4.3 | | | 4.3 | 4.3 | 4.3 |
| | Multifunctional epoxy resin 2 | (B2) | | | 4.3 | | | | |
| | Multifunctional epoxy resin 3 | (B3) | | | | 4.3 | | | |
| | Multifunctional epoxy resin 4 | (BC) | | | | | | | |
| | Curing agent | (C) | 2.0 | 2.0 | 2.0 | 2.0 | 1.6 | 1.1 | 0.6 |
| | Triazole-based compound | (D1) | 0.1 | | 0.1 | 0.1 | 1.0 | 2.0 | 3.0 |
| | | (D2) | | 0.1 | | | | | |
| | Curing accelerator | (E) | 0.5 | 0.5 | 0.5 | 0.5 | 0.5 | 0.5 | 0.5 |
| | Inorganic filler | (F) | 85 | 85 | 85 | 85 | 85 | 85 | 85 |
| | Carnauba wax (release agent) | | 0.3 | 0.3 | 0.3 | 0.3 | 0.3 | 0.3 | 0.3 |
| | Carbon black (colorant) | | 0.3 | 0.3 | 0.3 | 0.3 | 0.3 | 0.3 | 0.3 |
| Evaluation of performances | Spiral flow [cm] | | 97 | 98 | 95 | 101 | 90 | 85 | 76 |
| | Adhesion strength to copper [N/mm$^2$] | | 23.9 | 27.3 | 26.1 | 25.3 | 24.1 | 22.1 | 21.5 |
| | Heat resistance (glass transition temperature) [° C.] | | 252 | 254 | 241 | 218 | 249 | 245 | 241 |

TABLE 2

|  |  |  | Comparative Example 1 | Comparative Example 2 | Comparative Example 3 | Comparative Example 4 |
|---|---|---|---|---|---|---|
| Component (parts by mass) | Multifunctional benzoxazine compound | (A) | 7.5 | 7.5 | 7.5 | 7.5 |
|  | Multifunctional epoxy resin 1 | (B1) | 4.3 |  |  |  |
|  | Multifunctional epoxy resin 2 | (B2) |  | 4.3 |  |  |
|  | Multifunctional epoxy resin 3 | (B3) |  |  | 4.3 |  |
|  | Multifunctional epoxy resin 4 | (BC) |  |  |  | 4.3 |
|  | Curing agent | (C) | 2.1 | 2.1 | 2.1 | 2.0 |
|  | Triazole-based compound | (D1) |  |  |  | 0.1 |
|  |  | (D2) |  |  |  |  |
|  | Curing accelerator | (E) | 0.5 | 0.5 | 0.5 | 0.5 |
|  | Inorganic filler | (F) | 85 | 85 | 85 | 85 |
|  | Carnauba wax (release agent) |  | 0.3 | 0.3 | 0.3 | 0.3 |
|  | Carbon black (colorant) |  | 0.3 | 0.3 | 0.3 | 0.3 |
| Evaluation of performances | Spiral flow [cm] |  | 84 | 85 | 87 | 102 |
|  | Adhesion strength to copper [N/mm$^2$] |  | 17.9 | 15.7 | 15.1 | 24.1 |
|  | Heat resistance (glass transition temperature) [° C.] |  | 257 | 248 | 223 | 161 |

The curable resin composition of each of Examples had a spiral flow of 75 cm or more, the cured product thereof had an adhesion strength to copper, of 20 N/mm$^2$ or more, and the cured product thereof had a Tg of 200° C. or more, and it was found that fluidity, adhesiveness and high heat resistance were highly achieved. On the other hand, Comparative Examples 1, 2 and 3 were relatively favorable in heat resistance, but were low in adhesion strength. Comparative Example 4 was favorable in fluidity and adhesion strength, but was low in Tg and inferior in heat resistance.

It has been found from the foregoing results that a curable resin composition according to an embodiment of the present invention can be cured to thereby provide a cured product that can satisfy both high adhesiveness and high heat resistance.

The invention claimed is:

1. A curable resin composition containing
    (A) a multifunctional benzoxazine compound having at least two benzoxazine rings, the multifunctional benzoxazine compound being at least one multifunctional benzoxazine compound selected from a multifunctional benzoxazine compound having a structural unit of formula (1) and a multifunctional benzoxazine compound represented by a structure of formula (2),
    (B) a multifunctional epoxy compound having at least one norbornane structure and at least two epoxy groups,
    (C) a curing agent, and
    (D) a triazole-based compound,

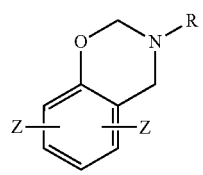
(1)

wherein in the formula (1), R represents an acyclic alkyl group having 1 to 12 carbon atoms, a cyclic alkyl group having 3 to 8 carbon atoms, or an aryl group having 6 to 14 carbon atoms, where the aryl group optionally has halogen or an acyclic alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

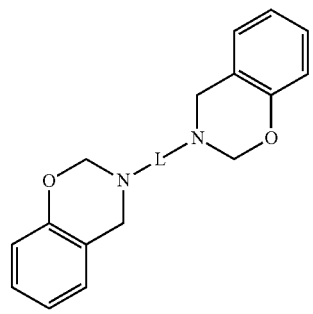
(2)

wherein in the formula (2), L represents a divalent organic group having 1 to 5 aromatic rings or an alkylene group having 2 to 10 carbon atoms, and the divalent organic group and the alkylene group optionally comprise oxygen and/or sulfur, and wherein the multifunctional epoxy compound (B) has at least one moiety represented by the following formula (4)

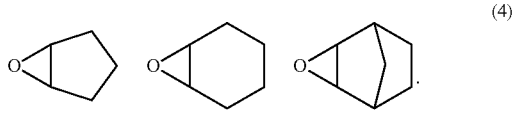

2. The curable resin composition according to claim 1, further containing (E) a curing accelerator.

3. The curable resin composition according to claim 1, further containing (F) an inorganic filler.

4. The curable resin composition according to claim 1, wherein the triazole-based compound (D) is a compound having a 1,2,4-triazole ring.

5. The curable resin composition according to claim 1, wherein the triazole-based compound (D) is a compound represented by general formula (9-1):

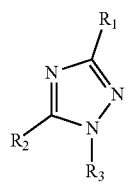
(9-1)

wherein $R_1$, $R_2$, and $R_3$ each independently represent a hydrogen atom, an amino group, a mercapto group, an alkyl group, an aryl group, or a carboxy group, and the alkyl group and the aryl group are optionally substituted, provided that at least one of $R_1$, $R_2$, and $R_3$ represents a mercapto group.

6. The curable resin composition according to claim 1, wherein the triazole-based compound (D) is a compound represented by general formula (9-5):

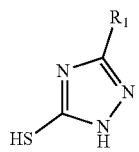
(9-5)

wherein $R_1$ represents a hydrogen atom or an amino group.

7. The curable resin composition according to claim 1, wherein the compounding ratio of the triazole-based compound (D) is 0.1 to 30 parts by mass based on 100 parts by mass in total of (A), (B) and (C).

8. The curable resin composition according to claim 1, the triazole-based compound (D) has at least one mercapto group.

9. A cured product obtained by curing the curable resin composition according to claim 1.

10. A semiconductor device, wherein a semiconductor element is disposed in a cured product obtained by curing the curable resin composition according to claim 1.

11. A method of producing a curable resin composition, the method comprising:
a step of mixing
(A) a multifunctional benzoxazine compound having at least two benzoxazine rings, the multifunctional benzoxazine compound being at least one multifunctional benzoxazine compound selected from a multifunctional benzoxazine compound having a structural unit of formula (1) and a multifunctional benzoxazine compound represented by a structure of formula (2),
(B) a multifunctional epoxy compound having at least one norbornane structure and at least two epoxy groups,
(C) a curing agent, and
(D) a triazole-based compound to obtain a mixture; and
a step of processing the mixture into a powdery, pelletized, or granular curable resin composition;

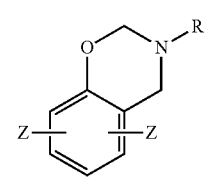
(1)

wherein in the formula (1), R represents an acyclic alkyl group having 1 to 12 carbon atoms, a cyclic alkyl group having 3 to 8 carbon atoms, or an aryl group having 6 to 14 carbon atoms, where the aryl group optionally has halogen or an acyclic alkyl group having 1 to 12 carbon atoms, as a substituent; and each Z represents hydrogen, a hydrocarbon group having 1 to 8 carbon atoms and/or a linking group and is optionally the same or different, at least one Z represents a linking group, and benzoxazine rings are linked by the linking group;

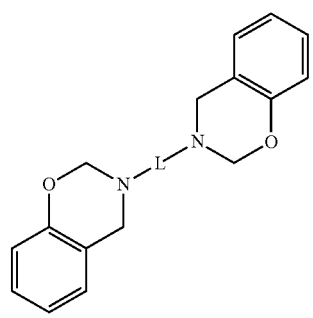
(2)

wherein in the formula (2), L represents a divalent organic group having 1 to 5 aromatic rings or an alkylene group having 2 to 10 carbon atoms, and the divalent organic group and the alkylene group optionally comprise oxygen and/or sulfur; and
wherein the multifunctional epoxy compound (B) has at least one moiety represented by the following formula (4)

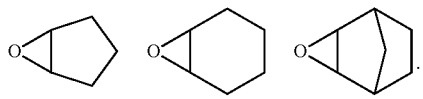
(4)

12. The method of producing a curable resin composition according to claim 10, wherein the mixture is obtained by further mixing (E) a curing accelerator and/or (F) an inorganic filler.

13. A method of producing of a cured product, the method comprising
   a step of heating the curable resin composition produced by the method according to claims 10 to 180 to 300° C. for curing.

* * * * *